United States Patent [19]

Weinberg

[11] Patent Number: 5,293,111
[45] Date of Patent: Mar. 8, 1994

[54] METHOD FOR MINIMIZING THE SWITCHING LOSS IN A POWER SWITCH

[75] Inventor: Alan H. Weinberg, Sassenheim, Netherlands

[73] Assignee: Agence Spatiale Europeenne, Paris Cedex, France

[21] Appl. No.: 823,752

[22] Filed: Jan. 22, 1992

[30] Foreign Application Priority Data

Jan. 22, 1991 [FR] France .................. 91 00669

[51] Int. Cl.⁵ .......................................... H02M 3/335
[52] U.S. Cl. .................................. 323/222; 323/233; 323/282; 323/319; 363/20
[58] Field of Search ............... 323/222, 282, 285, 233, 323/235, 220, 221, 223, 319; 363/16, 21, 97, 20, 95, 97, 55, 56; H02M 3/335

[56] References Cited

U.S. PATENT DOCUMENTS

| | | | |
|---|---|---|---|
| 4,675,796 | 6/1987 | Gautherin et al. | 363/20 |
| 4,725,768 | 2/1988 | Watanabe | 323/222 |
| 4,814,963 | 3/1989 | Petersen | 363/20 |
| 4,857,822 | 8/1989 | Tabisz et al. | 323/282 |
| 4,959,764 | 9/1990 | Bassett | 363/16 |
| 5,008,795 | 4/1991 | Parsley et al. | 363/20 |
| 5,099,406 | 3/1992 | Harada | 363/20 |

FOREIGN PATENT DOCUMENTS 2295615 7/1976 France .

*Primary Examiner*—R. Skudy
*Assistant Examiner*—Ben M. Davidson
*Attorney, Agent, or Firm*—John Q. McQuillan

[57] ABSTRACT

A switching current converter is connected in parallel with each controlled power switch in an electric circuit so that it is allowed to operate from the input voltage and transfer energy from input to output during the turn-on periods of the controlled power switch, whereby each power switch is allowed to be turned ON when a near-to-zero voltage is present across it. The switching converter serves as an active power switch stress relieving means, resulting in minimizing the switching loss in the power switch while providing the energy for operation of the power switch in a very efficient way.

2 Claims, 5 Drawing Sheets

METHOD FOR MINIMIZING THE SWITCHING LOSS IN A POWER SWITCH

BACKGROUND OF THE INVENTION

The invention relates to power switches such as power transistors and diodes and in particular to a method for reducing switching loss in a power switch, e.g. a pulse-width-modulated power switch.

The switching losses constitute the major limitation to the use of power switches at high switching frequencies such as those which are required for instance in a power converter in order to reduce the mass of magnetic and capacitive components.

Several snubber circuits have been proposed so far for solving this important problem and among other patents relating to the subject is U.S. Pat. No. 4,669,023. However, all prior art snubber circuits have the disadvantage that they only have a low efficiency so that any power loss saving of the power switch was paid for by the inefficiency of the snubber circuit itself resulting in little total power gain. The reasons for the low efficiency of the state-of-the-art snubber circuits are the following.

Generally the object of the snubber circuit was to relieve the main power switch of the voltage and current stress associated with power switching and many of the snubber circuits use very inefficient techniques resulting in a total decrease in efficiency.

In most prior art snubber circuits, the power switch is used for providing the energy to the circuit, which has a double consequence: 1) an additional stress is put on the power switch, and 2) the power switch is chosen with a low resistance, but this constitutes a handicap for the switching part of its working cycle because a low resistance is normally incompatible with a high switching speed.

In other arrangements, the energy used by the circuit is taken from the power supply and is returned to the input. Hence a low total efficiency is achieved. An example of zero voltage switching converter of this kind is disclosed in U.S. Pat. No. 4,959,764.

SUMMARY OF THE INVENTION

It is the object of the present invention to minimize the switching loss in power switches, with a higher efficiency than the prior art.

This object is achieved in accordance with the invention by connecting switching converter means in parallel with each controlled power switch so that it is allowed to operate from the input voltage and transfer energy from input to output during the turn-on periods of the controlled power switch, whereby each power switch is allowed to be turned ON when a near-to-zero voltage is present across it.

In one exemplary embodiment, a transformer having a primary winding and a secondary winding is arranged with the primary winding being connected in series with first switching means across the input voltage, while the secondary winding is being arranged in series connection with a second unidirectional switch means across the output and a capacitor is arranged in parallel with a respective controlled power switch. The latter is controlled so that it is turned ON only after said first switching means is turned ON, whereby said power switch is allowed to turn ON with a near-to-zero voltage across it.

In another exemplary embodiment, the primary winding of the transformer is arranged in series connection with first switching means across the controlled power switch, the secondary winding is connected in series with second unidirectional switch means across the output and a capacitor is arranged in parallel with a respective controlled power switch. The latter is controlled so that it is turned ON only after said first switching means is turned ON, whereby said power switch is allowed to turn ON with a near-to-zero voltage across it.

The invention may be used in numerous different converter or regulator topologies, e.g. boost or buck converter, forward converter, push-pull converter, etc.

In the invention, the switching DC-to-DC converter is acting as an active power switch stress relieving means which results in minimizing the switching loss in the snubbed power switch while providing the energy for operation of the snubbed power switch in a very efficient way. Further, all the energy is coupled from input to output in a very efficient way, thereby achieving a high total efficiency.

In addition, the invention allows pulse-width-modulated (PWM) converters to operate at very high frequency and/or efficiency, resulting in low-mass power systems. Also, by making the switching edges of the power switch slower, transmission of unwanted electromagnetic switching noise is reduced.

The invention will be more readily understood by reference to the accompanying drawings and the description to follow.

DESCRIPTION OF EXEMPLARY EMBODIMENTS OF THE INVENTION

Figure 1:
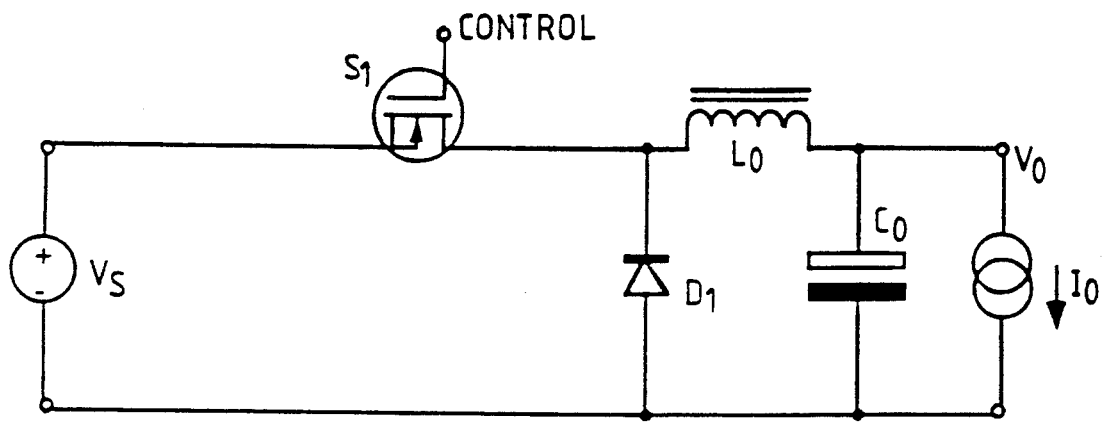
FIG. 1 illustrates a prior art buck current regulator.

The invention will be described when used in a conventional buck current regulator as represented in FIG. 1. Such a regulator comprises a pulse width modulated (PWM) power switch S1 that controls the magnitude of the current flowing through the inductor Lo according to the required output voltage Vo across the output port or according to the required output current Io. Switch S1 is shown by way of example by a transistor fed by a voltage source Vs connected across the input port of the apparatus. The unidirectional switch D1 (e.g. a diode) provides a path for the current in inductor Lo when switch S1 is OFF. Power switch S1 is turned ON or OFF in response to control pulses applied to its control electrode or gate.

Switch S1 has finite turn-off and turn-on times and diode D1 causes a reverse recovery current to flow through it when turned OFF. The result of these nonideal conditions during the switching transitions of switch S1 is that the current through it and the voltage across it exist simultaneously, which causes a loss in the switch. This switching loss is proportional to the frequency and is thus a major limitation to high frequency operation.

Figure 2:
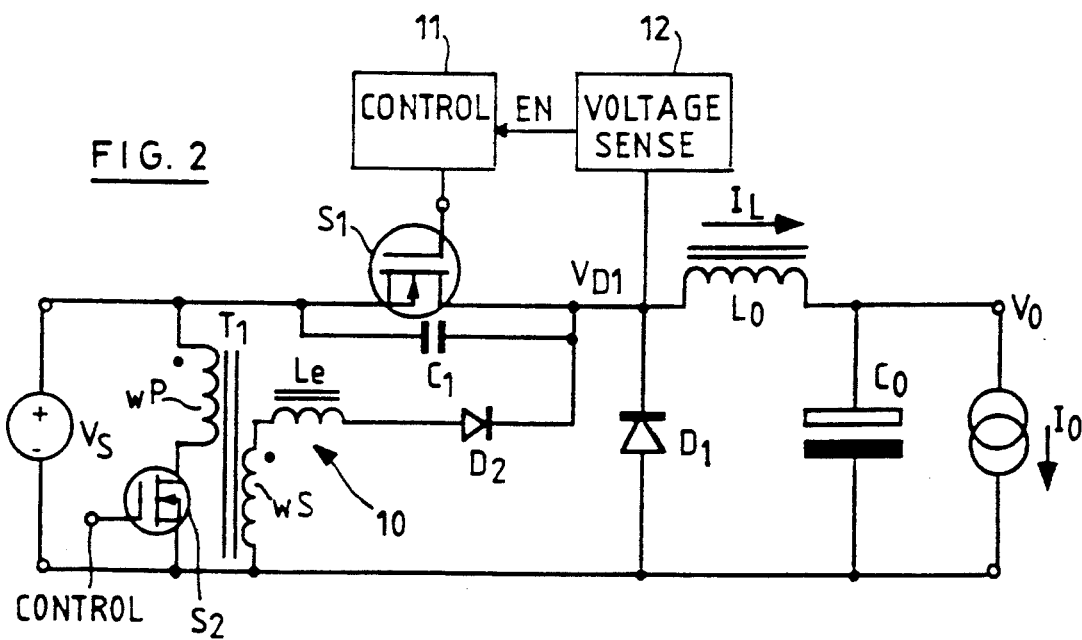
FIG. 2 illustrates the regulator of FIG. 1 with the invention incorporated therein.

The exemplary circuit described herein above is modified according to the invention as shown in FIG. 2. The modification consists in connecting a low power switching DC-to-DC converter 10 in parallel arrangement with the controlled power switch S1 so that it is allowed to operate from the input voltage and transfer energy from input to output during the switching periods of the controlled power switch S1. The purpose of the switching converter 10 is to set the voltage across the power switch S1 to be near to zero during its turn-on (rise of current) and turn-off (fall of current) periods, thereby significantly reducing the switching loss.

In the exemplary embodiment of FIG. 2, the switching converter 10 comprises a transformer T1, the primary winding wP of which is arranged in series connection with a controlled switching device S2 (here shown as a transistor) across the input voltage Vs. The secondary winding wS of transformer T1 is arranged in series connection with a unidirectional switch D2 (here shown as a diode). Also included is a capacitor C1 connected across power switch S1.

Figure 3:
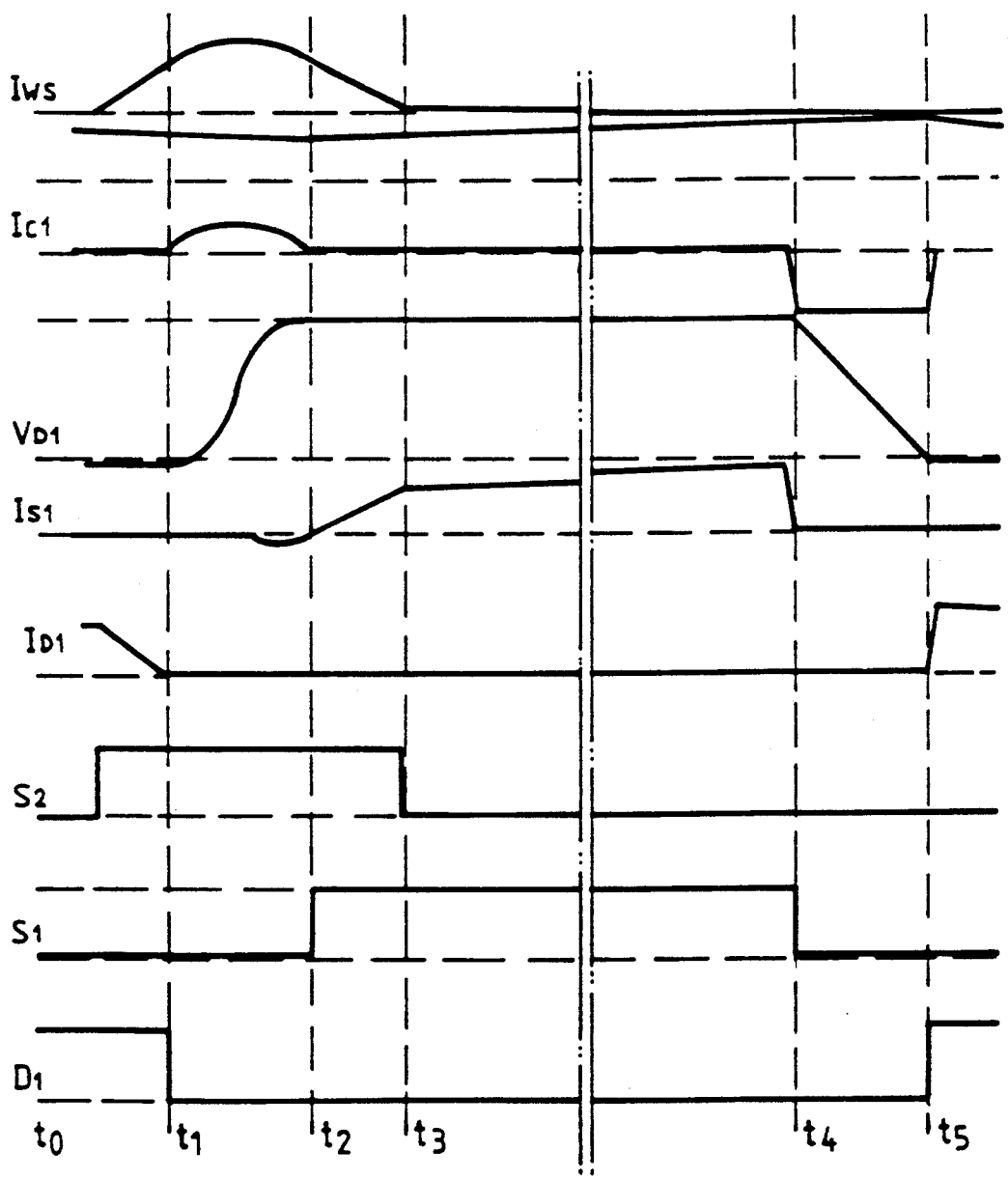
FIGS. 3 to 8 illustrate the operation of the apparatus represented in FIG. 2.

The operation of switching converter 10 is illustrated by FIGS. 3 to 8: FIG. 3 shows typical waveforms in the arrangement of FIG. 2 and FIGS. 4 to 8 show the current paths being set in the arrangement during five successive time periods.

Figure 4:
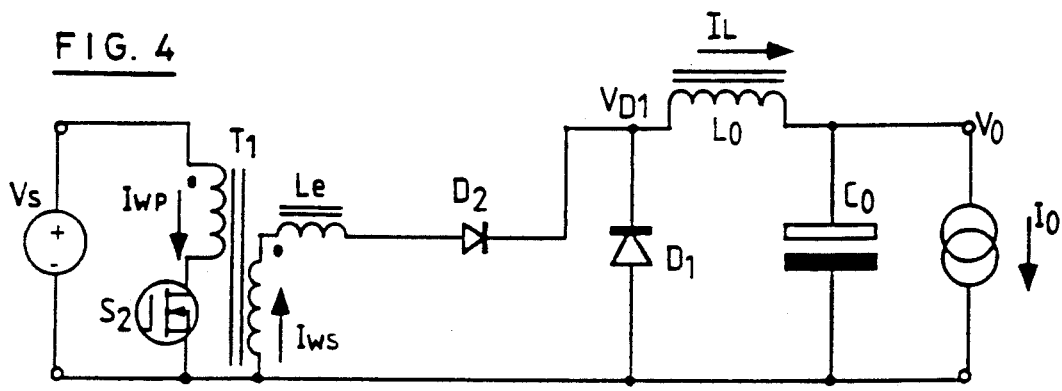

Period t0-t1 (FIG. 4)

It will be considered that main switch S1 is OFF and the inductor current ID1 is flowing through diode D1. Before switch S1 is turned ON, switch S2 is turned ON at time t0. A current Iws flows through the secondary winding of transformer T1 and through diode D2. Because of the equivalent inductance Le of transformer T1, that current builds up in a linear way starting from zero at a rate of nVs/Le (where n is the ratio of numbers of secondary to primary turns of T1) until it equals the value IL of the current flowing in the inductance Lo at time t1.

Figure 5:
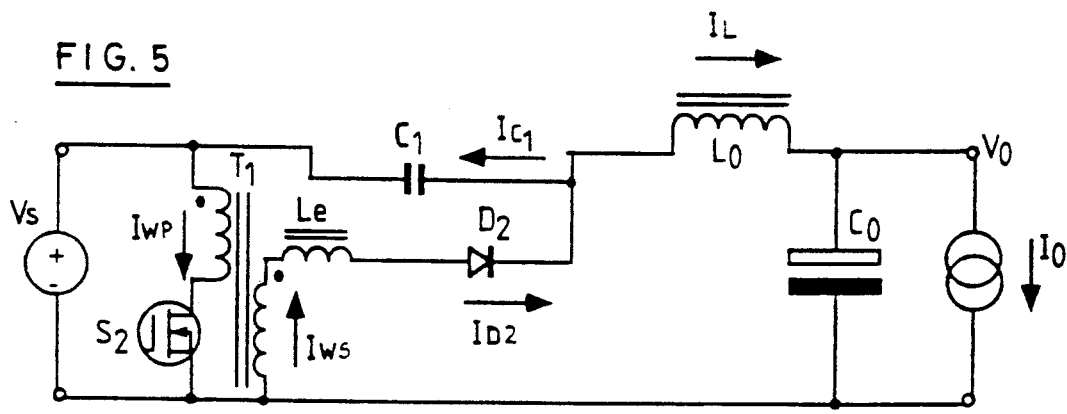

Period t1-t2 (FIG. 5)

The secondary winding of transformer T1 provides all the current IL, the current through diode D1 becomes zero and D1 turns OFF, thereby allowing the voltage VD1 across its terminals to rise. Since the current Iws builds up at a controlled rate, the turn-off of diode D1 is made soft, i.e. the reverse recovery current is near to zero. Because switch S2 is still ON, the current Iws continues to flow and the voltage across capacitor C1 decreases to zero at time t2. The discharge of C1 is sinusoidal in nature due to the resonance of C1 and Le. At time t2, if the current Iws is still greater than IL, the excess current will try to raise the voltage but this cannot happen because the anti-parallel intrinsic diode of switch S1 clamps this voltage to the input voltage Vs.

Figure 6:
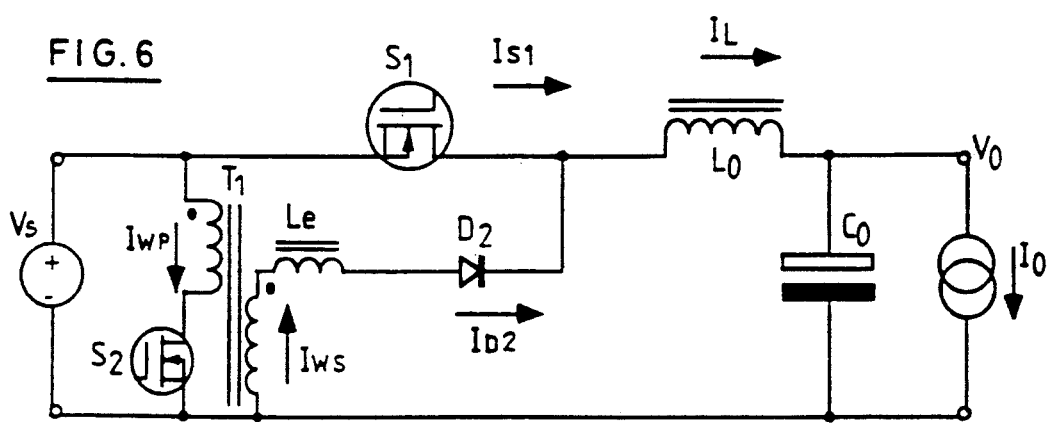

Period t2-t3 (FIG. 6)

At time t2, with near zero voltage across S1, this switch can be turned ON with a very low switching loss. Between times t2 and t3, the current Iws falls to zero and at time t3, switch S2 is turned OFF with only a small current through it. Since both the turn-on and turn-off of switch S2 occur with low values of conducted current its switching loss can be made very low. The sum of the currents Iws and Is1 equals the instantaneous value of current IL, the current Is1 through switch S1 builds up from zero at a rate equal to the fall of current Iws.

Figure 7:
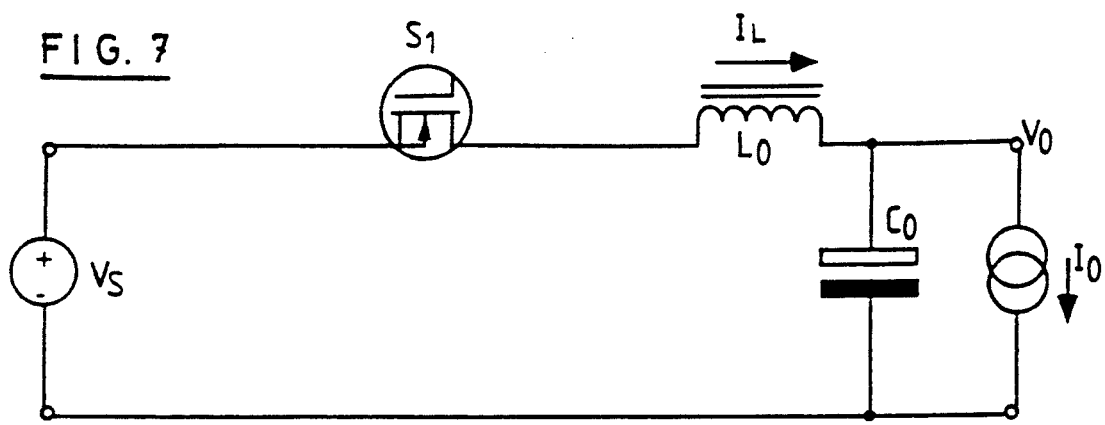

Period t3-t4 (FIG. 7)

Between times t3 and t4, the current in the secondary winding of T1 is zero and switch S1 conducts the current IL.

Figure 8:
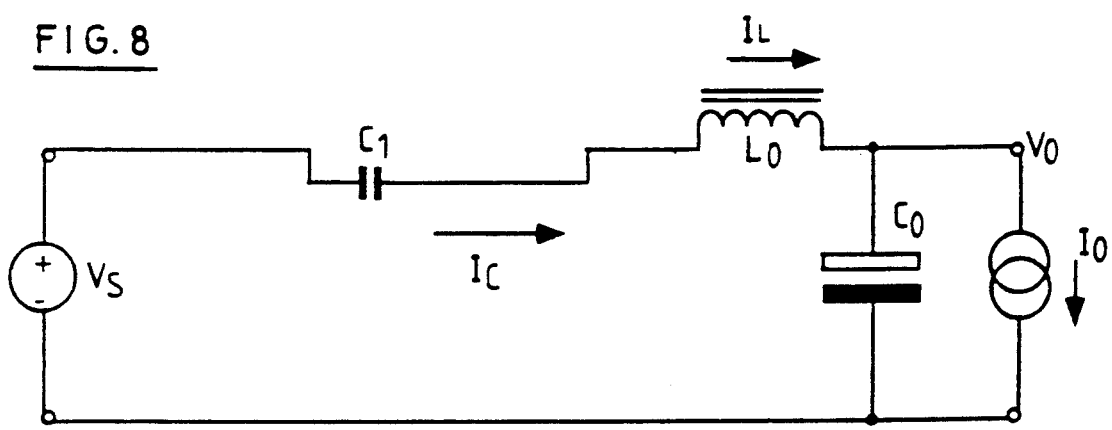

Period t4-t5 (FIG. 8)

At time t4, switch S1 is turned OFF. The current IL is then provided by capacitor C1. The voltage Vs1 across the switch S1 falls from the value Vs to zero at time t5 when diode D1 turns ON. During the turn-off of switch S1, capacitor C1 provides most of the current IL, so that the loss during the turn-off of S1 is kept very low.

It is apparent from the foregoing description of operation that the power switch S1 should be allowed to switch only when the voltage across it is near to zero, which happens if the voltage across diode D1 equals the value of the input voltage Vs. Referring again to FIG. 2, the switch S1 is thus controlled by suitable control means 11 arranged to generate a control pulse in response to an enabling pulse EN. Said enable pulse is produced by a voltage sense device 12 connected for measuring the voltage VD1 across diode D1 and for producing said enabling pulse when the voltage VD1 has reached the input voltage value Vs. FIG. 3 shows that switch S2 is turned ON first and when the voltage across main switch S1 is near to zero, switch S1 is allowed to turn ON in a lossless way.

An advantage in using a switching current converter according to the invention resides in that all the power of the converter is being coupled from the input to the output, thereby to result in achieving a high total efficiency.

In addition, the current converter provides protection of the voltage source Vs automatically in case of failure of diode D1. As a matter of fact, when the diode D1 causes a short circuit of the voltage source, the output voltage VD1 is zero and the voltage sense device 12 inhibits switch S1 to turn ON as explained hereabove. Thus, no short circuit of the supply voltage Vs can occur as it happens in the prior art arrangements, wherein it is the usual practice to arrange two redundant diodes D1 in series for more failure tolerant operation. Deleting the extra diode, in accordance with this invention, also provides an increase in efficiency.

Figure 9:
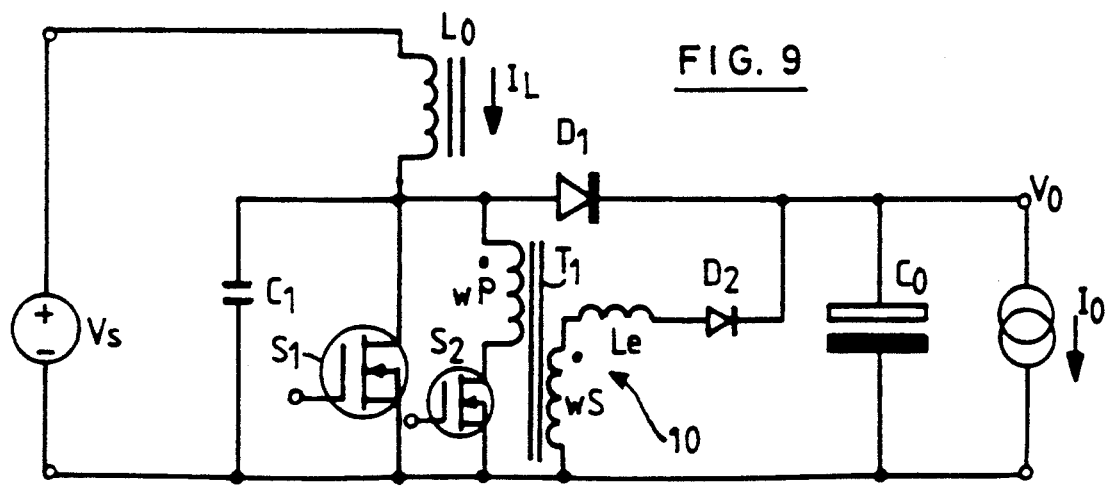
FIGS. 9, 10 and 11 illustrate the application of the invention to three other typical exemplary converters.
Figure 10:
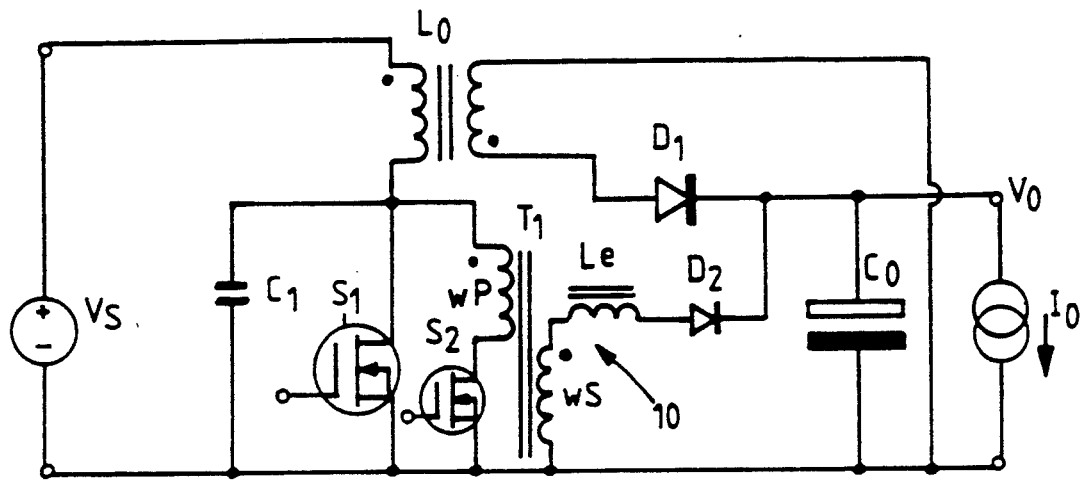
Figure 11:
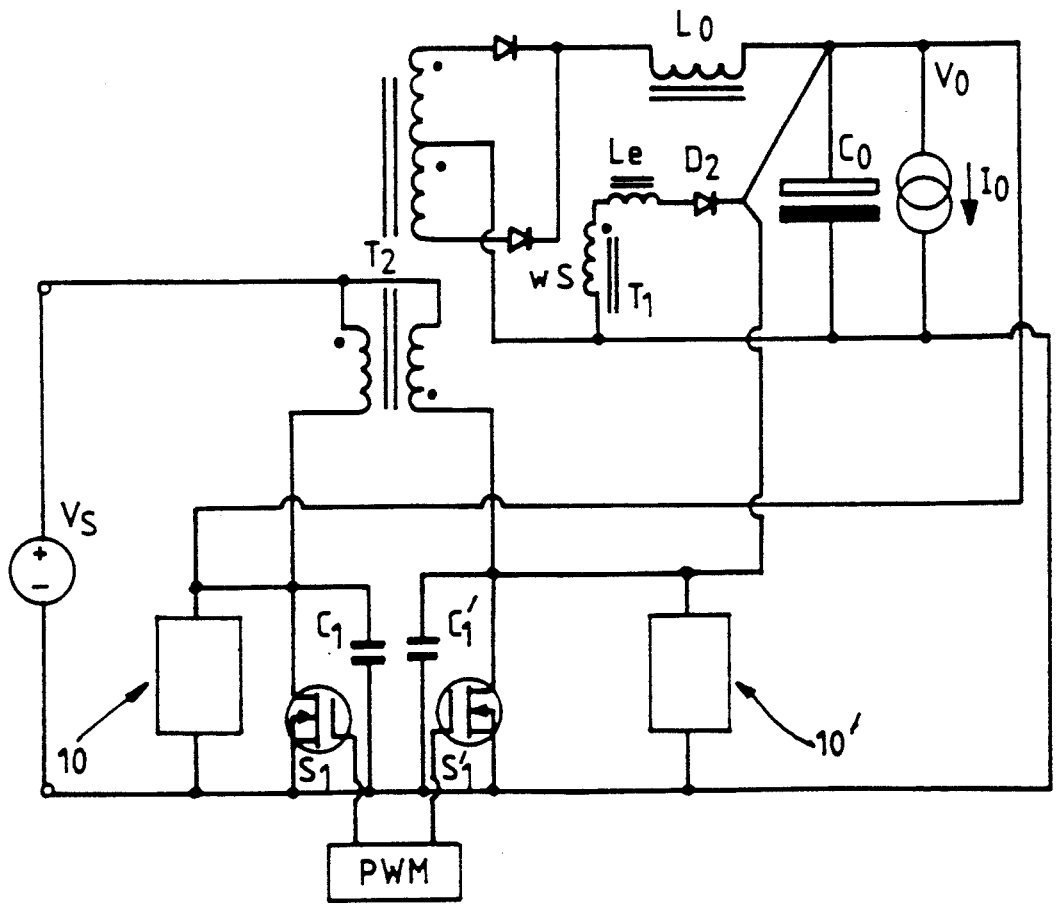

The embodiments described above are intended to be exemplary and it is to be noted that the invention may be applied to numerous other converter topologies, e.g. boost converter, forward converter, push-pull converter. For example, FIG. 9 shows the circuit of a typical boost converter comprising the invention. The switching converter 10 therein operates in a similar way to that for the buck converter of FIG. 2 except that now it is the input current of converter 10 that forces the voltage across main switch S1 to be zero just before it is turned ON. The waveforms are similar to those shown in FIG. 3. FIG. 10 shows the circuit of a typical forward converter comprising the invention. FIG. 11 shows the typical circuit (known per se) of a PWM push-pull converter comprising the invention. This arrangement comprises a transformer T2 and two power switches S1 and S1'. According to the invention, in parallel with each power switch there is arranged a switching converter 10, 10' as shown in FIG. 9. Each active switching converter controls the corresponding power switch as described hereabove and serves as a stress relieving means for that power switch.

In view of the above disclosure, modifications, variations and equivalent arrangements will be obvious to one having ordinary skill in the art without departing from the scope of the invention.

I claim:

1. A method for minimizing the switching loss in at least one controlled power switch connected in an electric circuit having an input connected across an input voltage source and having an output, the method comprising the step of connecting switching converter means in parallel with the at least one controlled power switch so that the switching converter means is allowed to operate from the input voltage and transfer energy from input to output of the controlled power switch during the turn-on periods of the controlled power switch, the step of connecting switching converter means including providing transformer means having a primary winding and a secondary winding, the primary winding being connected in series with the switching converter means across the input voltage, connecting the secondary winding in series with unidirectional switch means, the secondary winding and the unidirectional switch means being connected across the output of the at least one controlled power switch, providing capacitor means connected in parallel with the at least one controlled power switch, and allowing the controlled power switch to turn ON only after the at least one switching converter means is turned ON, whereby the controlled power switch is allowed to turn ON with a near-to-zero voltage across it.

2. A method for minimizing switching loss in at least one controlled power switch connected in an electric circuit having an input connected across an input voltage source and having an output, the method comprising the step of connecting switching converter means in parallel with each controlled power switch so that the switching converter means is allowed to operate from the input voltage and transfer energy from input to output of the controlled power switch during turn-on periods of the controlled power switch, the step of providing switching converter means comprises providing transformer means having a primary winding and a secondary winding, the primary winding being connected in series with the switching converter means across the controlled power switch, providing the secondary winding in series with unidirectional switch means, the secondary winding and the unidirectional switch means being connected across the output of the controlled power switch, connecting capacitor means in parallel with the controlled power switch, allowing the controlled power switch to turn ON only after the switching converter means is turned ON, whereby the controlled power switch is allowed to turn ON with a near-to-zero voltage across it.

* * * * *